United States Patent
Lee et al.

(10) Patent No.: US 8,621,409 B2
(45) Date of Patent: Dec. 31, 2013

(54) SYSTEM AND METHOD FOR REDUCING LAYOUT-DEPENDENT EFFECTS

(75) Inventors: Hui Yu Lee, Hsin-Chu (TW); Feng Wei Kuo, Zhudong Township (TW); Ching-Shun Yang, Zhudong Township (TW); Yi-Kan Cheng, Taipei (TW); Jui-Feng Kuan, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/459,288

(22) Filed: Apr. 30, 2012

(65) Prior Publication Data

US 2013/0290916 A1    Oct. 31, 2013

(51) Int. Cl.
*G06F 17/50*    (2006.01)

(52) U.S. Cl.
USPC .......... 716/119; 716/110; 716/111; 716/118; 716/122; 716/100; 716/101; 716/103; 716/104; 716/106

(58) Field of Classification Search
USPC ......... 716/100–101, 103–104, 106, 110–111, 716/118–119, 122
See application file for complete search history.

(56) References Cited

U.S. PATENT DOCUMENTS

| | | | | |
|---|---|---|---|---|
| 5,933,356 A * | 8/1999 | Rostoker et al. | ................. | 703/15 |
| 6,996,790 B2 * | 2/2006 | Chang | ............................. | 716/56 |
| 7,337,420 B2 | 2/2008 | Chidambarrao et al. | | |
| 7,765,511 B1 * | 7/2010 | Perez et al. | .................... | 716/108 |
| 8,185,368 B2 * | 5/2012 | Bolcato et al. | .................. | 703/13 |
| 8,281,270 B2 * | 10/2012 | Drennan et al. | ............... | 716/112 |
| 8,407,646 B2 * | 3/2013 | Chandramohan et al. | ..... | 716/126 |
| 8,418,098 B2 * | 4/2013 | Huang | ............................ | 716/106 |
| 2002/0152447 A1 * | 10/2002 | Venugopal et al. | ............... | 716/4 |
| 2003/0188277 A1 * | 10/2003 | Murakami | ........................ | 716/4 |
| 2004/0015803 A1 * | 1/2004 | Huang et al. | .................... | 716/10 |
| 2004/0111688 A1 * | 6/2004 | Lee et al. | ......................... | 716/12 |
| 2005/0216873 A1 * | 9/2005 | Singh et al. | ........................ | 716/5 |
| 2007/0094622 A1 * | 4/2007 | Lee et al. | .......................... | 716/4 |
| 2009/0172617 A1 * | 7/2009 | Huang et al. | ...................... | 716/5 |
| 2009/0326873 A1 * | 12/2009 | Wang et al. | ........................ | 703/1 |
| 2010/0050138 A1 | 2/2010 | Chidambarrao et al. | | |
| 2011/0055782 A1 * | 3/2011 | Drennan et al. | .............. | 716/112 |
| 2012/0023465 A1 * | 1/2012 | Gopalakrishnan et al. | ... | 716/102 |
| 2012/0198394 A1 * | 8/2012 | Pikus et al. | ....................... | 716/53 |
| 2012/0304146 A1 * | 11/2012 | Jiang et al. | .................... | 716/139 |
| 2013/0007684 A1 * | 1/2013 | Kramer et al. | ................. | 716/112 |

OTHER PUBLICATIONS

Solido Design Automation, "Proximity+0 Package, varation-aware custom IC design fast-accurate-high capacity", 2010. Solido design automation, pp. 1-2.*

(Continued)

*Primary Examiner* — Stacy Whitmore
(74) *Attorney, Agent, or Firm* — Duane Morris LLP

(57) ABSTRACT

A method includes extracting a first netlist from a first layout of a semiconductor circuit and estimating layout-dependent effect data based on the first netlist. A first simulation of the semiconductor circuit is performed based on the first netlist using an electronic design automation tool, and a second simulation of the semiconductor circuit is performed based on a circuit schematic using the electronic design automation tool. A weight and a sensitivity of the at least one layout-dependent effect are calculated, and the first layout of the semiconductor circuit is adjusted based on the weight and the sensitivity to provide a second layout of the semiconductor circuit. The second layout is stored in a non-transient storage medium.

20 Claims, 5 Drawing Sheets

(56) References Cited

OTHER PUBLICATIONS

McAndrew, C., "Proximity Effect Modeling", Freescale Semiconductor, Tempe, AZ, 2011, Oxford University Press, 9 pages.

Kanamoto, T., et al., "Impact of Well Edge Proximity Effect on Timing", IEICE Trans. Fundamentals, Dec. 2008, E91-A:3461-3464.

* cited by examiner

SYSTEM AND METHOD FOR REDUCING LAYOUT-DEPENDENT EFFECTS

FIELD OF DISCLOSURE

The disclosed system and method relate to integrated circuit design flow and semiconductor device fabrication. More particularly, the disclosed system and method relate to integrated circuit design flow and semiconductor devices fabricated with a reduced layout-dependent effect (LDE).

BACKGROUND

Semiconductor processing techniques continue to improve such that smaller devices can be fabricated. One example of a semiconductor processing technique is complementary metal-oxide semiconductor ("CMOS") processing. As the devices formed using CMOS processing continue to be scaled down, tensile stresses attributed to layout-dependent effects ("LDEs") impact the performance of devices formed using these advanced processing techniques.

For example, the LDEs impact the threshold voltage ("Vth") of a device, the saturation current ("Idsat") of a device, and the DC operation current ("Id") of a device. Such device impacts affect the overall performance of a circuit regardless of whether a circuit is a radio frequency ("RF") circuit, an analog or mixed signal circuit, or a digital circuit.

DETAILED DESCRIPTION

This description of the exemplary embodiments is intended to be read in connection with the accompanying drawings, which are to be considered part of the entire written description.

The disclosed systems and methods enable the effects of LDE in advanced process technologies, e.g., 45 nm and beyond, to be reduced by a novel feedback adjustment loop. Reducing LDEs improves the performance of various circuit types including, but not limited to, radio frequency ("RF") circuits, analog/mixed signal circuits, and digital circuits.

Figure 1:
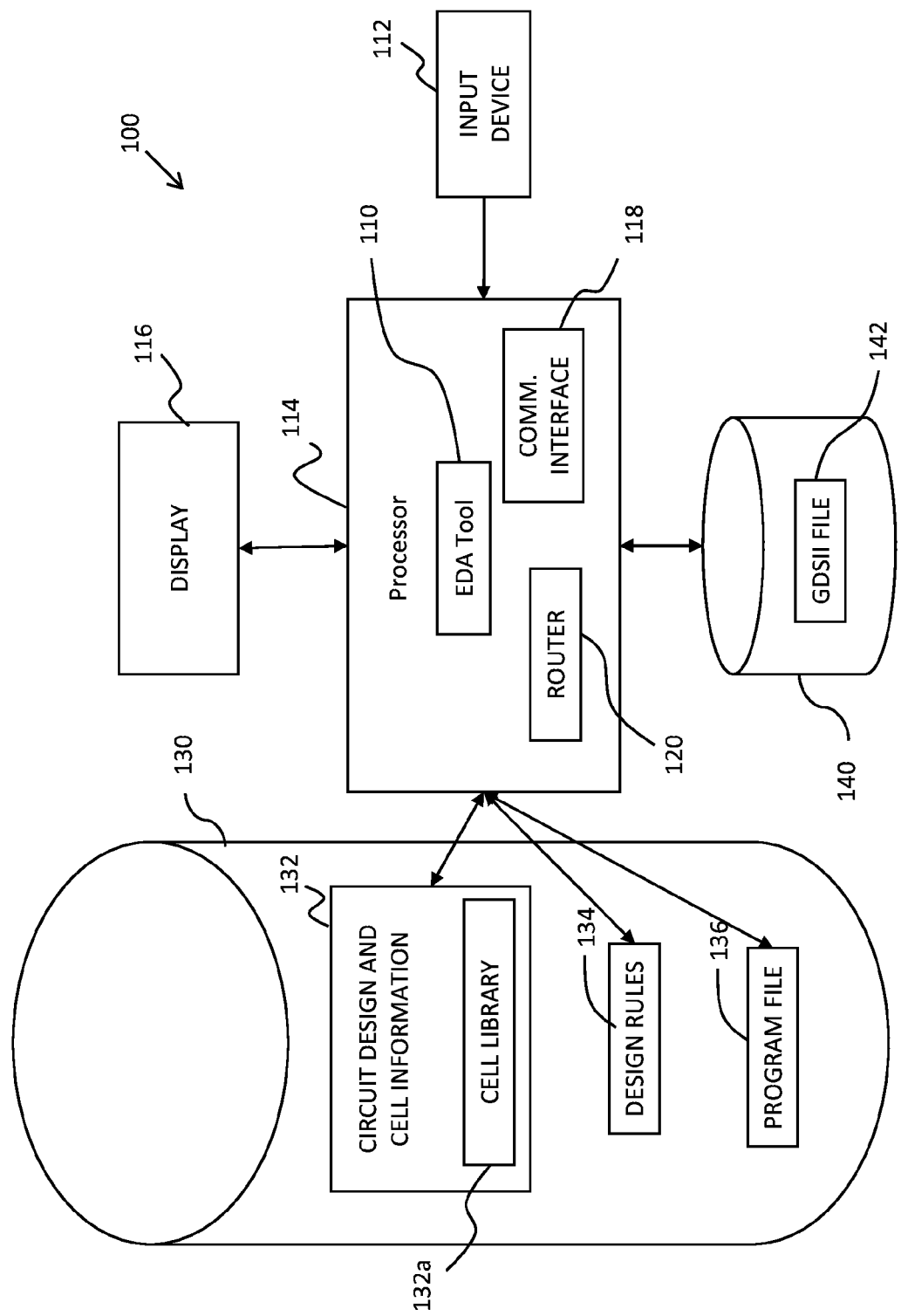
FIG. 1 illustrates one example of a system configured to perform the improved method set forth in FIG. 2.

FIG. 1 illustrates one example of a system 100 configured to perform the improved method described below. As shown in FIG. 1, system 100 includes an electronic design automation ("EDA") tool 110 such as "IC COMPILER"™, sold by Synopsys, Inc. of MOUNTAIN View, Calif., having a place and route tool including a router 120 such as "ZROUTE"™, also sold by Synopsys. Other EDA tools 110 may be used, such as, for example, the "VIRTUOSO" custom design platform or the Cadence "ENCOUNTER"® digital IC design platform along with the "VIRTUOSO" chip assembly router 120, all sold by Cadence Design Systems, Inc. of San Jose, Calif.

The EDA tool 110 is a special purpose computer formed by retrieving stored program instructions 136 from a computer readable storage medium 130, 140 and executing the instructions on a general purpose processor 114. Processor 114 may be any central processing unit ("CPU"), microprocessor, micro-controller, or computational device or circuit for executing instructions. The non-transient machine readable storage medium 130, 140 may be a flash memory, random access memory ("RAM"), read only memory ("ROM"), or other storage medium. Examples of RAMs include, but are not limited to, static RAM ("SRAM") and dynamic RAM ("DRAM"). ROMs include, but are not limited to, programmable ROM ("PROM"), electrically programmable ROM ("EPROM"), and electrically erasable programmable ROM ("EEPROM"), to name a few possibilities.

System 100 may include a display 116 and a user interface or input device 112 such as, for example, a mouse, a touch screen, a microphone, a trackball, a keyboard, or other device through which a user may input design and layout instructions to system 100. The one or more computer readable storage mediums 130, 140 may store data input by a user such as a circuit design and cell information 132, which may include a cell library 132a, design rules 134, one or more program files 136, and one or more graphical data system ("GDS") II files 142.

EDA tool 110 may also include a communication interface 118 allowing software and data to be transferred between EDA tool 110 and external devices. Examples of a communications interface 118 include, but are not limited to, a modem, an Ethernet card, a wireless network card, a Personal Computer Memory Card International Association ("PCMCIA") slot and card, or the like. Software and data transferred via communications interface 218 may be in the form of signals, which may be electronic, electromagnetic, optical, or the like that are capable of being received by communications interface 118. These signals may be provided to communications interface 118 via a communications path (e.g., a channel), which may be implemented using wire, cable, fiber optics, a telephone line, a cellular link, a radio frequency ("RF") link and other communication channels.

Router 120 is capable of receiving an identification of a plurality of cells to be included in a circuit layout, including a list 132 of pairs of cells, selected from the cell library 132a, within the plurality of cells to be connected to each other. Design rules 134 may be used for a variety of processing technologies (e.g., technology greater than, less than, or equal to 45 nm). In some embodiments, the design rules 134 configure the router 120 to locate connecting lines and vias on a manufacturing grid. Other embodiments may allow the router to include off-grid connecting lines and/or vias in the layout.

Figure 2:
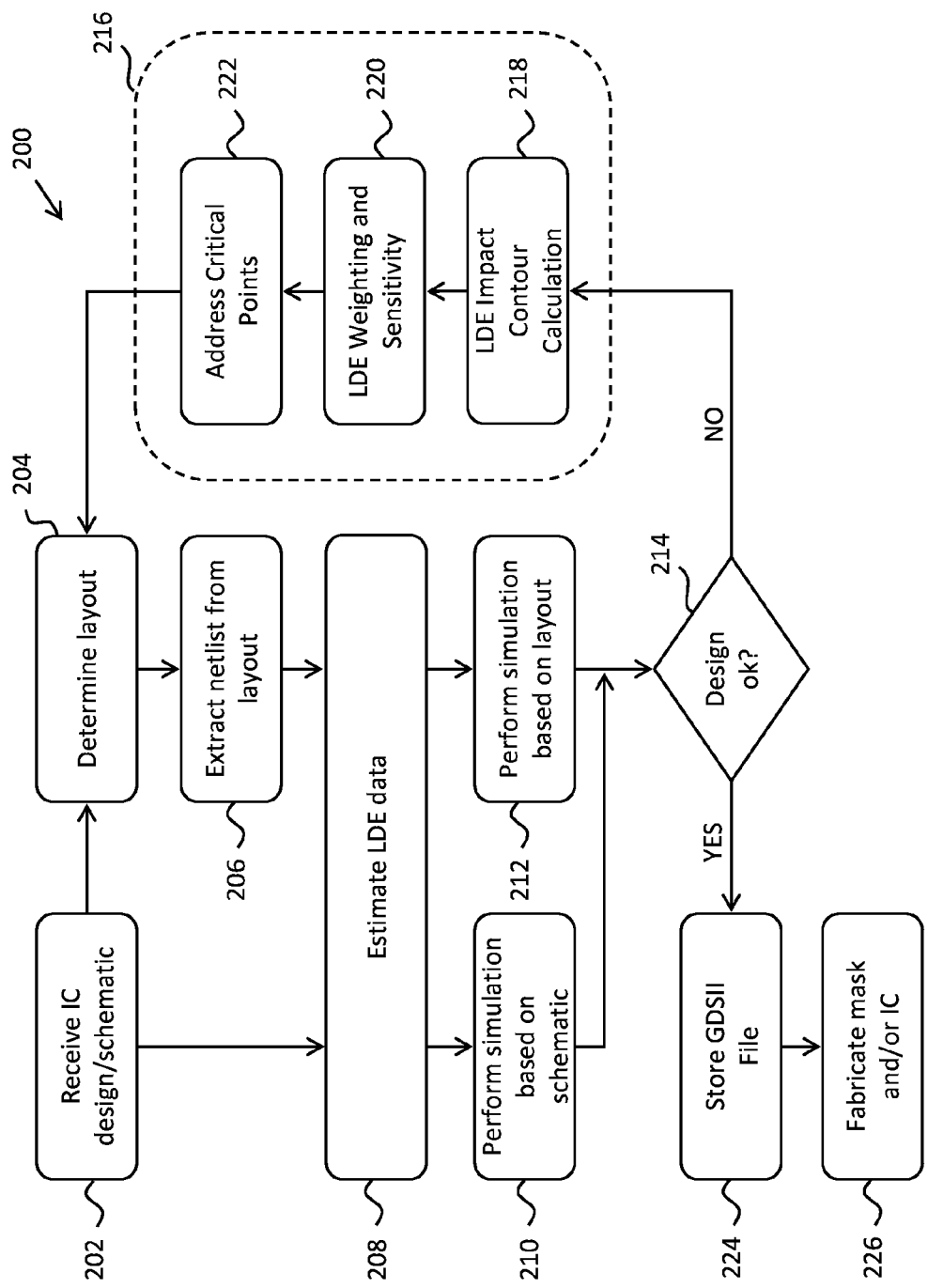
FIG. 2 is a flow diagram of one example of an improved method for designing and fabricating a circuit having reduced layout-dependent effects.

FIG. 2 is a flow diagram of one example of a method 200 of designing an integrated circuit (IC) such that a fabricated IC has reduced LDE issues. As shown in FIG. 2, an IC design/schematic is received at block 202. At block 204, a layout of the IC is generated by the place and route tool based on the design/schematic received at block 202. The layout of the IC includes a representation of the IC in planar form. For example, the layout includes an identification/positioning of active devices including doped regions in the semiconductor substrate and locations at which the conductive gates of transistors are to be formed. The layout also includes conductive routing, which are disposed in conductive layers disposed over the doped semiconductor substrate. The conductive routings provide for interconnections for the active devices formed in the doped semiconductor substrate.

At block 206, a netlist is extracted from the layout determined at block 204. As will be understood by one of ordinary skill in the art, the netlist includes values of R, C, and sensitivities and are used to prepare timing analysis for user-specified frequencies and frequency domain analysis.

At block 208, LDE data are estimated from the schematic and from the netlist. In some embodiments, estimating LDE data includes identifying relevant device information such as, for example, cell name, width, current, and LDE instance parameters. As will be understood by one of ordinary skill in the art, system 100 is configured to perform LDE extraction from a schematic and from a netlist. The LDE parameters estimated based on the schematic provide a "best case" scenario for the circuit since the schematic does not provide a layout.

The layout provides a better real-world approximation as active areas, poly regions, and wells have spacing distances that result in LDEs. Such LDEs are typically categorized into well-proximity effects ("WPE"), length of diffusion ("LOD") effects (sometimes referred to as "shallow trench isolation effects"), active spacing effects ("OSE"), and poly spacing effects ("PSE"). These LDEs impact, among other things, the threshold voltage ("Vth") of a device, the saturation current ("Idsat") of a device, and the DC operation current ("Id") of a device.

The WPEs are derived from the spacing between an edge of a well to an edge of a gate and are denoted as "SC". Transistor models are designed to accept SCA, SCB, and SCC as instance parameters, which are implemented to correct for the WPE. The article "Proximity Effect Modeling" by Colin McAndrew and published by Oxford University Press, the entirety of which is herein incorporated by reference, details the manner in which the values for SCA, SCB, and SCC are derived. OSE parameters include, but are not limited to, SA5, SA6, SODX, SODX1, SODX2, and SODY. Examples of PSE parameters include, but are not limited to, SA, SPA, SPA1, SPA2, SPA3, SAP, SAPB, SPBA, SPBA1, and SA4. These LDE parameters are stored in a non-transient machine readable storage medium 130, 140.

Index flags are provided in the database in which the LDE parameters are stored that identify the LDE source. As described below, the flags can be set such that the system 100 will take the LDE sources into an account when performing an analysis. In addition to creating index flags to identify the LDE source type, first, second, or higher order polynomial functions are provided to estimate the impact of the particular LDE parameters (e.g., fun(wpe), fun(ose), and fun(pse)) have on the overall device and/or circuit performance.

In some embodiments, the function describing the WPEs is expressed as fun(wpe)=Cal[SCA,SCB,SCC]. The function describing the OSEs is expressed as fun(ose)=Cal[SA5, SA6, SODX,SODX1,SODX2,SODY], and the PSE function is expressed as fun(pse)=Cal[SPA,SPA1,SPA2,SPA3,SAP, SAPB,SPBA,SPBA1,SA4]. The fun(wpe) function is derived using the pre-layout simulation and recording the SCA, SCB, and SCC values. The physical layout is used to estimate the WPE parameters SCA, SCB, and SCC, Well boundaries in the physical layout are modified and another set of SCA, SCB, and SCC values are estimated. A polynomial equation is fitted to the trend of the SCA, SCB, and SCC distribution. Letting x denote SCA, y denote SCB, and z denote SCC the fun(wpe) is derived as follows:

$$fun(wpe)_x = A_3 x^3 + A_2 x^2 + A_1 x^1 + A_0$$

$$fun(wpe)_y = B_3 y^3 + B_2 y^2 + B_1 y^1 + B_0$$

$$fun(wpe)_z = C_3 z^3 + C_2 z^2 + C_1 z^1 + C_0$$

$$fun(wpe) = \Sum_{n=x,y,z} fun(wpe)\_n$$

Where $A_{n=3,2,\ldots,0}$; $B_{n=3,2,\ldots,0}$; and $C_{n=3,2,\ldots,0}$ are fitting coefficients.

The functions fun(ose) and fun(pse) are derived in a similar manner using their respective parameters. The functions and flags are used to create an equation that can be used to identify the impact of a particular category of LDE (e.g., WPE, OSE, PSE) on the device performance. Equation 1 below is an example of one such an equation that can be used to assess the impacts of the LDEs on the current:

$$I_{Phy} = I_{free} \times (1 + \text{Flag}_{wpe} \cdot fun(wpe) + \text{Flag}_{pse} \cdot fun(pse) + \text{Flag}_{ose} \cdot fun(ose)) \quad \text{Eq. (1)}$$

Where, $I_{phy}$ is the total current of the physical device; and $I_{free}$ is the simulated current without taking LDEs into account.

At block 210, a pre-layout or layout independent simulation of the schematic is performed. As described above, the simulation of the schematic provides a "best case" performance of the circuit as the schematic lacks the resolution and detail of parameters relevant to LDE provided by the layout. For example, the schematic does not identify irregular shapes of doping regions and spacing between wells, active areas, and poly regions that are identifiable in a layout and which change device performance. Thus, if the relatively optimistic layout-independent simulation indicates that there is a timing performance problem, it is likely that a layout-based simulation would also identify timing problems. The pre-layout simulation result can enable the designer to recognize certain timing problems early (before completing the time-consuming layout process), and modify the design at the schematic design level before performing the complete layout routing process in step 204. The data obtained by the simulation at block 210 is stored in a non-transient machine readable storage medium 130, 140.

At block 212, a simulation of the layout based on the derived netlist is performed. The simulation of the layout provides a more accurate estimate of the performance of the circuit as the spacing between wells, spacing between poly regions, and other physical parameters identified by the layout are taken in account by system 100. The data obtained by the simulation at block 212 is stored in a non-transient machine readable storage medium 130, 140.

At decision block 214, the simulation data from the simulations at block 210 and 212 are analyzed to determine whether the design and layout performs acceptably. In some embodiments, acceptable performance of the circuit determined by checking to ensure the timing and operating voltages perform within imposed design limits by comparing the simulation data to the design constraints. If the circuit performance is acceptable, then method 200 proceeds to block 224 at which point a GDSII file is created and stored in a non-transient machine readable storage medium 130, 140. One or more masks are created and the IC is fabricated at block 226 based on the GDSII file.

If the design is not acceptable, then method 200 moves to feedback adjustment loop 216. At block 218, an LDE contour calculation is performed.

Figure 3:
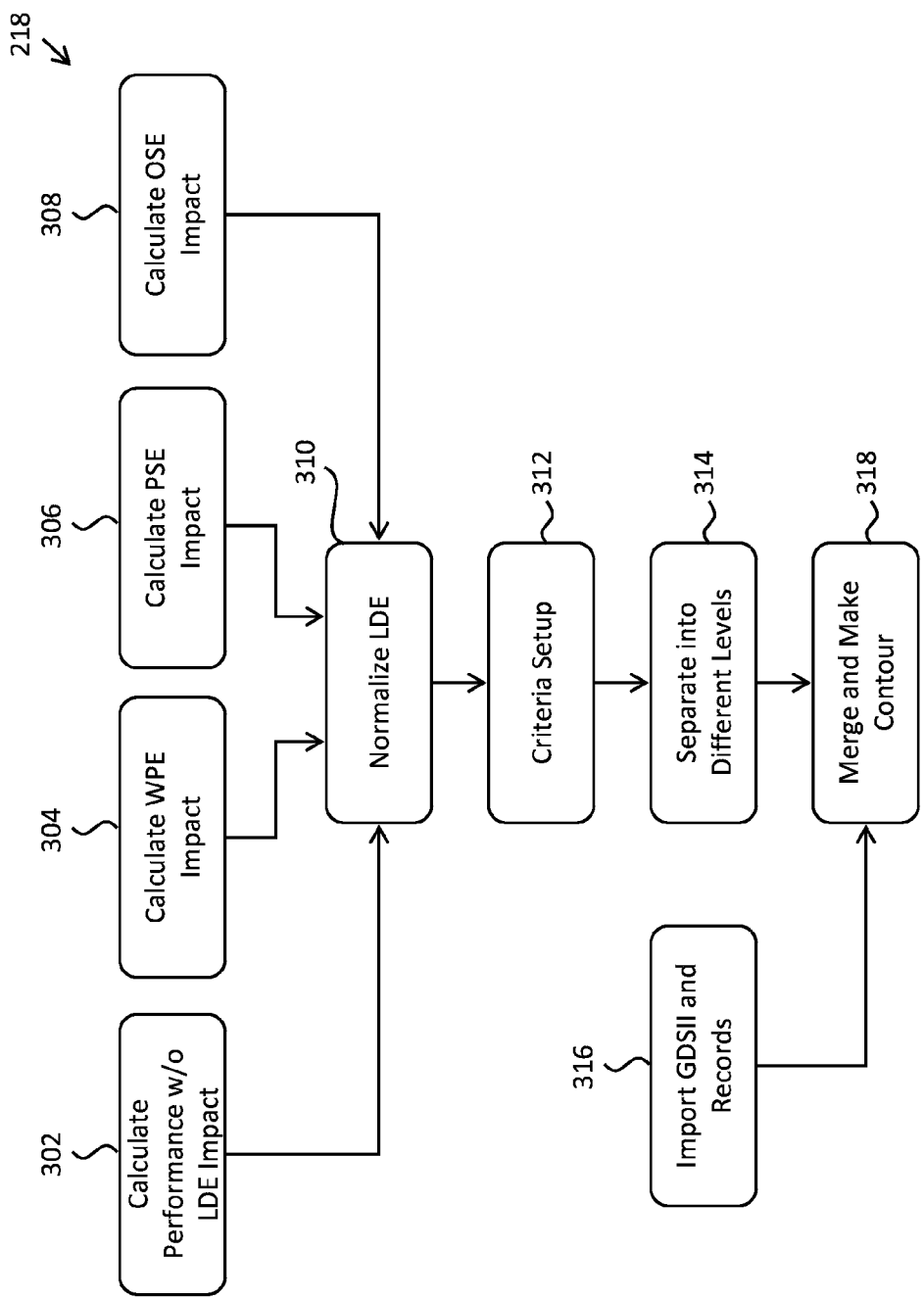
FIG. 3 is a flow diagram of one example of a method of calculating layout-dependent contours in accordance with the method illustrated in FIG. 2.

FIG. 3 illustrates one example of performing the LDE contour calculation at block 218. As shown in FIG. 3, a calculation is performed for each particular LDE category. For example, at block 302, Equation 1 is used to determine a particular parameter, such as current, I, for a device in the absence of LDE effects. Such calculation is obtained by setting the flags for LDE categories WPE, PSE, and OSE to zero, which results in Equation 1 simplifying to $I_{phy}=I_{free} \times 1 = I_{Phy} = I_{free}$.

At block 304, Equation 1 is used to determine the effect of the WPEs on the device parameter by setting the flag for WPE to one and the flags for the other LDE categories to zero. With these flags set, Equation 1 reduces to $I_{Phy}=I_{free} \times (1+\text{fun}(\text{wpe}))$.

At block 306, Equation 1 is used to determine the effect of the PSEs on the device parameter. The PSE flag is set to one and the flags for the LDEs are set to zero, which results in Equation 1 reducing to $I_{phy}=I_{free} \times (1+\text{fun}(\text{pse}))$.

At block 308, the effects of the OSEs on the device parameter are calculated. Using Equation 1 above, the effects of the OSEs on the device parameter are calculated by setting the WPE and PSE flags to zero and the OSE flag to one, which results in Equation 1 reducing to $I_{phy}=I_{free} \times (1+\text{fun}(\text{ose}))$.

The results of the calculations performed at blocks 304, 306, and 308 are normalized to the device performance without LDEs using the results obtained at block 302. For example, the device characteristics calculated at block 304, which identify the effects from WPEs, is normalized using the following equation:

$$I_{wpenorm} = \frac{(I_{free} - I_{Phy})_{wpe}}{I_{free}} \qquad \text{Eq. (2)}$$

The device characteristics calculated at block 306 are normalized using the following equation:

$$I_{psenorm} = \frac{(I_{free} - I_{Phy})_{pse}}{I_{free}} \qquad \text{Eq. (3)}$$

The device characteristics calculated at block 308 are normalized using the following equation:

$$I_{ose} = \frac{(I_{free} - I_{Phy})_{ose}}{I_{free}} \qquad \text{Eq. (4)}$$

At block 312, design criteria can optionally be entered into system 100. A designer can input a value of the change in performance he/she expects to occur as a result of changes that are to be made to the layout during feedback adjustment loop 216. The value input by the designer is based on the designer's experience and helps system 100 identify changes by focusing the changes to a limited range of performance improvement or decline. For example, if a user wants to see the LDE impact for a region that is 20% smaller than a current layout region, then the user can input the criteria as 0.8 and separate different levels or colors from 0.8 to 1. The system 100 performs an analysis and displays the results to the user such that the user can see the degree of the impact directly on the layout through a colored contour map. As described above, the criteria value can be set at any value including and between zero and one. The designer or user of system 100 inputs the design criteria into system 100 using input device 112.

At block 314, system 100 applies the design criteria to each of the LDE categories such that system 100 can calculate the expected impact of each LDE category. The calculated values are stored in a non-transient machine readable storage medium 130, 140.

At block 316, system 100 imports the GDSII file 142 and other associated records for the devices and circuit. A will be understood by one of ordinary skill in the art, the GDSII 142 file and other associated records can be stored in a non-transient machine readable storage medium 130, 140, which is accessed by processor 114.

At block 318, system 100 merges the GDSII file 142 and associated records with the designer criteria adjusted impact data and generates one or more contour maps, which are displayed to a user on display 116. FIGS. 4A-4D illustrate examples of the contour maps generated by processor 114 of system 100. FIG. 4A, for example, illustrates the physical layout of the devices of the circuit that does not take LDEs into account.

Figure 4B:
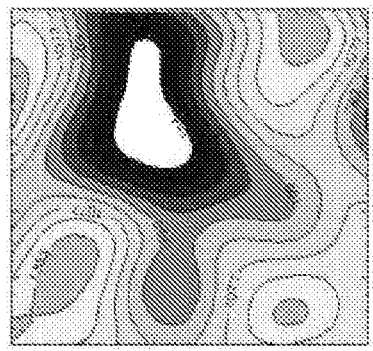
FIGS. 4A-4D are examples of contour maps identifying stresses attributed to different layout-dependent effects.
Figure 4D:
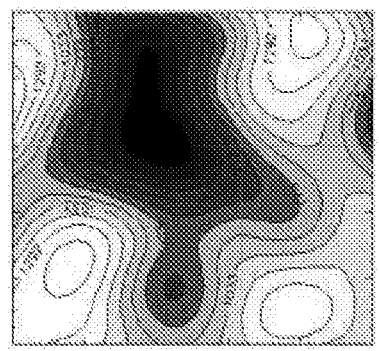
Figure 4A:
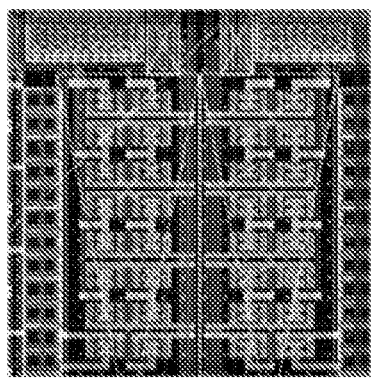
Figure 4C:
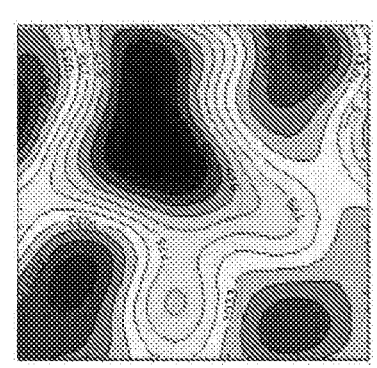

FIG. 4B is a contour map of the performance drop experiences by the layout in FIG. 4A that are attributable to the WPEs. FIG. 4C is a contour map illustrating the performance variations attributable to the PSEs, and FIG. 4D is a contour map illustrating the performance variations attributable to the OSEs. As will be understood by one of ordinary skill in the art, the different colors of the contour maps identify differences in device and circuit performance due to LDEs.

With the contour calculation(s) complete, feedback adjustment loop moves to block 220 where the LDE categories are weighted and sensitivities are calculated. The weighting for the WPEs, WPE$_{weight}$, is calculated as follows:

$$WPE_{weight} = \frac{\text{fun}(wpe)}{1 + \text{fun}(wpe) + \text{fun}(pse) + \text{fun}(ose)} \qquad \text{Eq. (5)}$$

The weighting for the PSEs, PSE$_{weight}$, is calculated using the following equation:

$$PSE_{weight} = \frac{\text{fun}(pse)}{1 + \text{fun}(wpe) + \text{fun}(pse) + \text{fun}(ose)} \qquad \text{Eq. (6)}$$

The OSE weighting, OSE$_{weight}$, is calculated as follows:

$$OSE_{weight} = \frac{\text{fun}(pse)}{1 + \text{fun}(wpe) + \text{fun}(pse) + \text{fun}(ose)} \qquad \text{Eq. (7)}$$

Reference is again made to FIG. 2. Calculating the LDE weightings advantageously identifies the particular LDE category having the greater effect on the performance of the devices and circuit. Sensitivities are also calculated at block 220, which indicate the manner in which changes to the layout will affect performance. For example, if an LDE sensitivity is positive, then moving the stress source away from the device will improve the performance. If an LDE sensitivity is negative, then the stress source should be moved towards the device to improve device performance. In some embodiments, the following equations are used to calculate the sensitivities for WPE, PSE, and OSE, i.e., WPE$_{sensitivity}$, PSE$_{sensitivity}$, and OSE$_{sensitivity}$:

$$WPE_{sensitivity} = \frac{1}{I_{free}} \cdot \frac{\Delta I_{Phy}}{\Delta fun(wpe)} \quad \text{Eq. (8)}$$

$$PSE_{sensitivity} = \frac{1}{I_{free}} \cdot \frac{\Delta I_{Phy}}{\Delta fun(pse)} \quad \text{Eq. (9)}$$

$$OSE_{sensitivity} = \frac{1}{I_{free}} \cdot \frac{\Delta I_{Phy}}{\Delta fun(ose)} \quad \text{Eq. (10)}$$

With the LDE weightings and sensitivities calculated, feedback adjustment loop 216 moves to block 222 where one or more critical points in the layout are addressed. The function at block 222 provide a designer with the ability to systematically and precisely identify the critical region(s) in the device and circuit layout based on the contour calculations, LDE weightings, and LDE sensitivities.

Figure 5:
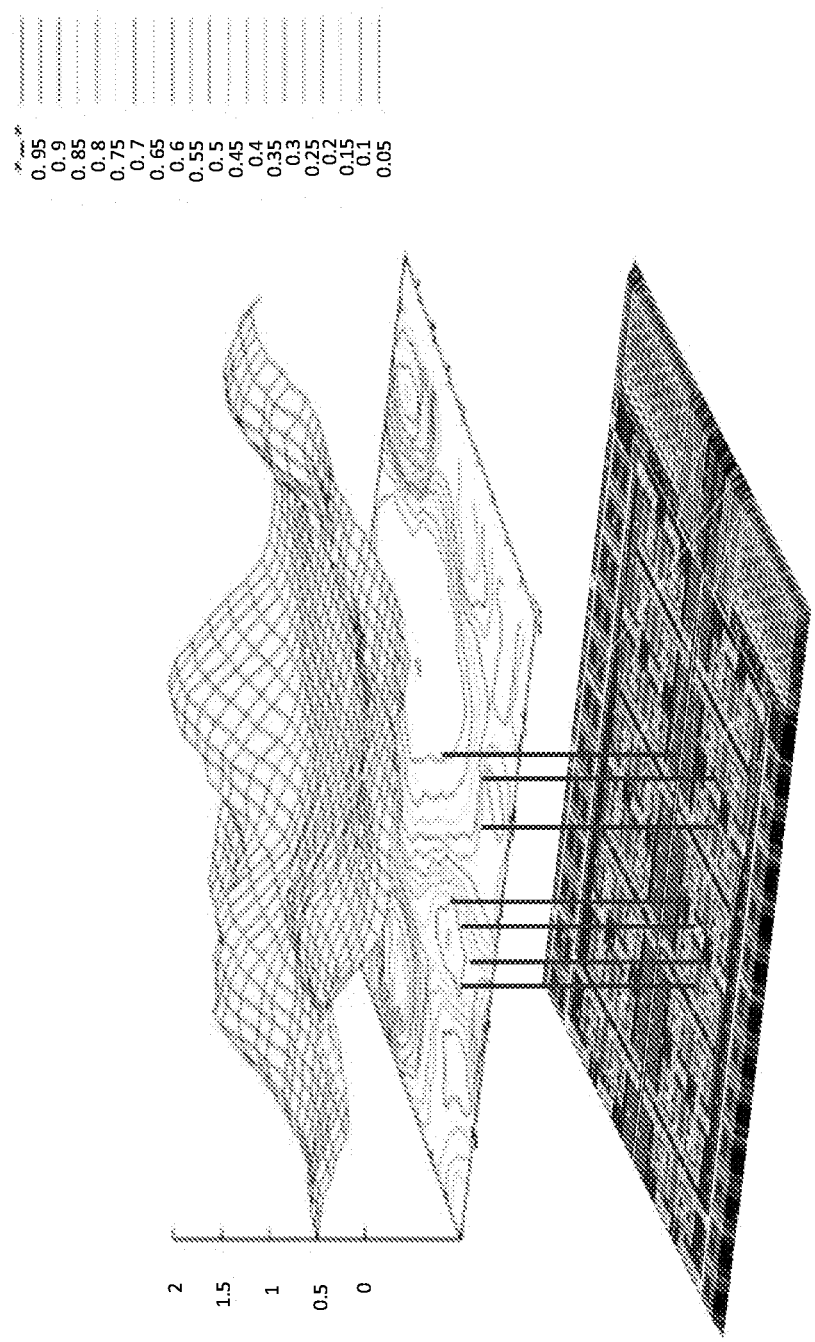
FIG. 5 is an example of a three-dimensional contour map identifying layout-dependent stresses based on the contour maps illustrated in FIGS. 4A-4D.

The weightings and sensitivities enable a user and/or system 100 to modify the model parameters that correspond to the layout of one or more devices in a circuit to provide improved performance with reduced LDEs. For example, FIG. 5 illustrates one example of three-dimensional ("3D") contour map derived from the individual contour maps shown in FIGS. 4A-4D. The 3D contour map illustrated in FIG. 5 identifies "hotspots" or areas where LDE stresses have a critical impact that degrades device and circuit performance.

A designer and/or system 100 uses the layout to adjust certain parameters, such as the spacing of a well boundary to an edge of a gate, of the device and/or circuit most attributable for the stresses. The changes made to the device and circuit models are made at block 204 and are stored in a non-transient machine readable storage medium 130, 140.

Process 200 then moves to block 206 where a netlist is extracted from the updated/modified layout. As described above, the netlist includes values of R, C, and sensitivities and are used to prepare timing analysis for user-specified frequencies and frequency domain analysis. The netlist generated after the adjustment feedback adjustment loop 216 is a modified netlist based on the changes made to the layout at block 222.

LDE data are extracted from the modified netlist at block 208. In some embodiments, the extraction of LDE data includes identifying relevant device information such as, for example, cell name, width, current, and LDE instance parameters. As will be understood by one of ordinary skill in the art, system 100 is configured to perform LDE extraction from a schematic and from a netlist. If changes are made to the schematic during adjustment feedback loop, then LDE data are extracted from the schematic at block 208.

At block 212, system 100 performs a simulation based on the netlist extracted at block 206 and LDE data extracted at block 208. As described above, the simulation of the layout takes into account the spacing between wells, spacing between poly regions, and other physical parameters identified by the layout and netlist. The data obtained by the simulation at block 212 is stored in a non-transient machine readable storage medium 130, 140.

At decision block 214, the post-layout simulation data from the simulation at block 212 (and a second simulation at block 210, if applicable) are analyzed to determine whether the design and layout performs acceptably. In some embodiments, acceptable performance of the circuit determined by checking to ensure the timing and operating voltages perform within imposed design limits by comparing the simulation data to the design constraints. If the circuit performance is acceptable, then method 200 proceeds to block 224 at which point a GDSII file is created and stored in a non-transient machine readable storage medium 130, 140. One or more masks are created and the IC is fabricated at block 226 based on the GDSII file.

If the design is not acceptable, then method 200 moves again to feedback adjustment loop 216. The number of times method 200 proceeds through feedback adjustment loop 216 is not limited. Accordingly, method 200 can repeatedly proceed through feedback adjustment loop 216, determine/adjust layout at block 204, netlist extraction at bock 206, LDE extraction at block 208, perform simulations at block 212, and assess whether the layout is acceptable at block 214 until the circuit performs acceptably.

The disclosed system and method advantageously provide efficient ways to design and fabricate a circuit on a semiconductor wafer that has reduced impacts from LDEs. Various circuit types, such as RF circuits, analog/mixed signal circuits, and digital circuits, all benefit from the iterative method described above.

In some embodiments, a method includes extracting a first netlist from a first layout of a semiconductor circuit and estimating layout-dependent effect data based on the first netlist. A first simulation of the semiconductor circuit is performed based on the first netlist using an electronic design automation tool, and a second simulation of the semiconductor circuit is performed based on a circuit schematic using the electronic design automation tool. A weight and a sensitivity of the at least one layout-dependent effect are calculated, and the first layout of the semiconductor circuit is adjusted based on the weight and the sensitivity to provide a second layout of the semiconductor circuit. The second layout is stored in a non-transient storage medium.

In some embodiments, a system includes a processor including an electronic design automation tool. The processor is configured to provide a first netlist from a first layout of a semiconductor circuit and estimate layout-dependent effect data from the first netlist. A first simulation of the semiconductor circuit based on the first netlist is performed by the processor, and a second simulation of the semiconductor circuit based on a circuit schematic is performed by the processor. The processor is configured to calculate a weight and a sensitivity of the at least one layout-dependent effect and configured to adjust the first layout of the semiconductor circuit based on the weight and the sensitivity to provide a second layout of the semiconductor circuit.

In some embodiments, a non-transient storage medium is encoded with program code, wherein when the program code is executed by a processor, the processor performs a method. The method includes extracting a first netlist from a first layout of a semiconductor circuit and estimating layout-dependent effect data based on the first netlist. A first simulation of the semiconductor circuit is performed based on the first netlist using an electronic design automation tool, and a second simulation of the semiconductor circuit is performed based on a circuit schematic using the electronic design automation tool. A weight and a sensitivity of the at least one layout-dependent effect are calculated, and the first layout of the semiconductor circuit is adjusted based on the weight and the sensitivity to provide a second layout of the semiconductor circuit. The second layout is stored in a non-transient storage medium.

The present invention can be embodied in the form of methods and apparatus for practicing those methods. The present invention can also be embodied in the form of program code embodied in tangible media, such as USB flash drives, secure digital ("SD") cards, CD-ROMs, DVD-ROMs, Blu-ray disks, hard drives, or any other non-transient machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method, comprising:
   extracting a first netlist from a first layout of a semiconductor circuit;
   estimating layout-dependent effect data based on the first netlist;
   performing a first simulation of the semiconductor circuit based on the first netlist using an electronic design automation tool;
   performing a second simulation of the semiconductor circuit based on a circuit schematic using the electronic design automation tool;
   calculating a weight and a sensitivity of the at least one layout-dependent effect;
   adjusting the first layout of the semiconductor circuit based on the weight and the sensitivity to provide a second layout of the semiconductor circuit; and
   storing the second layout in a non-transient storage medium.

2. The method of claim 1, wherein the least one layout-dependent effect includes one of a well-proximity effect, an active area spacing effect, and a poly spacing effect.

3. The method of claim 1, wherein estimating layout-dependent effect data includes categorizing a layout-dependent effect as one of a well-proximity effect, a active area spacing effect, and a poly spacing effect.

4. The method of claim 3, further comprising calculating an impact of at least one layout-dependent effect based on the first and second simulation.

5. The method of claim 4, wherein calculating the impact of at least one layout-dependent effect includes
   calculating a performance parameter of a device of the semiconductor circuit based on the second simulation;
   calculating the performance parameter of the device of the semiconductor circuit when subject to well-proximity effects;
   calculating the performance parameter of the device of the semiconductor circuit when subject to active area spacing effects;
   calculating the performance parameter of the device of the semiconductor circuit when subject to poly spacing effects; and
   normalizing the performance parameters of the device when subject to well-proximity effects, active area spacing effects, and poly spacing effects to the performance parameter of the device based on the second simulation.

6. The method of claim 4, wherein calculating the impact of at least one layout-dependent effect includes:
   generating a contour map identifying at least one stress attributable to at least one layout-dependent effect; and
   displaying the contour map to a user on a display.

7. The method of claim 1, wherein calculating the weight of the at least one layout-dependent effect includes:
   deriving a function for a first layout-dependent effect, the function approximating a performance parameter of a device of the semiconductor circuit based on a first set of physical parameters identified by the first layout; and
   deriving a function for a second layout-dependent effect, the function approximating a performance parameter of the device of the semiconductor circuit based on a second set of physical parameters identified by the first layout; and
   calculating a ratio of the function for the first layout-dependent effect relative to a sum of the function for the first layout-dependent effect and the function for the second layout-dependent effect.

8. A system, comprising:
   an electronic design automation tool including a processor configured to:
   provide a first netlist from a first layout of a semiconductor circuit;
   estimate layout-dependent effect data from the first netlist;
   perform a first simulation of the semiconductor circuit based on the first netlist and a second simulation of the semiconductor circuit based on a circuit schematic;
   calculate a weight and a sensitivity of the at least one layout-dependent effect; and
   adjust the first layout of the semiconductor circuit based on the weight and the sensitivity to provide a second layout of the semiconductor circuit.

9. The system of claim 8, wherein the least one layout-dependent effect includes one of a well-proximity effect, an active area spacing effect, and a poly spacing effect.

10. The system of claim 8, wherein when the processor is configured to categorize a layout-dependent effect as one of a well-proximity effect, an active area spacing effect, and a poly spacing effect when the processor extracts layout-dependent effect data.

11. The system of claim 10, wherein the processor is configured to calculate an impact of at least one layout-dependent effect based on the first and second simulations, wherein the impact calculation includes
   a calculation of a performance parameter of a device of the semiconductor circuit based on the second simulation;
   a calculation of a the performance parameter of the device of the semiconductor circuit when subject to well-proximity effects;
   a calculation of the performance parameter of the device of the semiconductor circuit when subject to active area spacing effects; and
   a calculation the performance parameter of the device of the semiconductor circuit when subject to poly spacing effects when the processor calculates the impact of the at least one layout-dependent effect.

12. The system of claim 11, wherein the processor is configured to normalize the performance parameters of the device when the device is subject to well-proximity effects, active area spacing effects, and poly spacing effects to the performance parameter of the device based on the second simulation.

13. The system of claim 12, wherein the processor is configured to:
   generate a contour map identifying at least one stress attributable to at least one layout-dependent effect; and
   display the contour map to a user on a display of the system.

14. The system of claim 8, wherein when calculating the weight of the at least one layout-dependent effect, the processor is configured to:
   derive a function for a first layout-dependent effect, the function approximating a performance parameter of a device of the semiconductor circuit based on a first set of physical parameters identified by the first layout; and
   derive a function for a second layout-dependent effect, the function approximating a performance parameter of the device of the semiconductor circuit based on a second set of physical parameters identified by the first layout; and
   calculate a ratio of the function for the first layout-dependent effect relative to a sum of the function for the first layout-dependent effect and the function for the second layout-dependent effect.

15. A non-transient storage medium encoded with program code, wherein when the program code is executed by a processor, the processor performs a method, the method comprising:
   extracting a first netlist from a first layout of a semiconductor circuit;
   estimating layout-dependent effect data from the first netlist;
   performing a first simulation of the semiconductor circuit based on the first netlist using an electronic design automation tool;
   performing a second simulation of the semiconductor circuit based on a circuit schematic using the electronic design automation tool;
   calculating a weight and a sensitivity of the at least one layout-dependent effect;
   adjusting the first layout of the semiconductor circuit based on the weight and the sensitivity to provide a second layout of the semiconductor circuit; and
   storing the second layout in a non-transient storage medium.

16. The non-transient storage medium of claim 15, wherein extracting layout-dependent effect data includes categorizing a layout-dependent effect as one of a well-proximity effect, an active area spacing effect, and a poly spacing effect.

17. The non-transient storage medium of claim 16, further comprising calculating an impact of at least one layout-dependent effect.

18. The non-transient computer readable storage medium of claim 17, wherein calculating the impact of at least one layout-dependent effect includes
   calculating a performance parameter of a device of the semiconductor circuit based on the second simulation;
   calculating the performance parameter of the device of the semiconductor circuit when subject to well-proximity effects;
   calculating the performance parameter of the device of the semiconductor circuit when subject to active area spacing effects;
   calculating the performance parameter of the device of the semiconductor circuit when subject to poly spacing effects; and
   normalizing the performance parameters of the device when subject to well-proximity effects, active area spacing effects, and poly spacing effects to the performance parameter of the device based on the second simulation.

19. The non-transient computer readable storage medium of claim 18, wherein calculating the impact of at least one layout-dependent effect includes:
   generating a contour map identifying at least one stress attributable to at least one layout-dependent effect; and
   displaying the contour map to a user on a display.

20. The non-transient computer readable storage medium of claim 15, wherein calculating the weight of the at least one layout-dependent effect includes:
   deriving a function for a first layout-dependent effect, the function approximating a performance parameter of a device of the semiconductor circuit based on a first set of physical parameters identified by the first layout; and
   deriving a function for a second layout-dependent effect, the function approximating a performance parameter of the device of the semiconductor circuit based on a second set of physical parameters identified by the first layout; and
   calculating a ratio of the function for the first layout-dependent effect relative to a sum of the function for the first layout-dependent effect and the function for the second layout-dependent effect.

* * * * *